Sept. 10, 1968 R. W. HELDA ET AL 3,400,448

METHOD OF BONDING FILAMENTARY MATERIAL

Filed Jan. 27, 1966 4 Sheets-Sheet 1

INVENTORS.
ROBERT W. HELDA and
WILLIAM E. LaPOINT

BY David M. Keay
AGENT

INVENTORS.
ROBERT W. HELDA and
WILLIAM E. LaPOINT

BY David M. Kesy
AGENT.

Sept. 10, 1968 R. W. HELDA ET AL 3,400,448

METHOD OF BONDING FILAMENTARY MATERIAL

Filed Jan. 27, 1966 4 Sheets-Sheet 3

INVENTORS.
ROBERT W. HELDA and
WILLIAM E. LaPOINT

BY David M. Keay

AGENT.

METHOD OF BONDING FILAMENTARY MATERIAL

Filed Jan. 27, 1966 4 Sheets-Sheet 4

INVENTORS.
ROBERT W. HELDA and
WILLIAM E. LaPOINT

BY David M. Keay

AGENT.

United States Patent Office 3,400,448
Patented Sept. 10, 1968

3,400,448

METHOD OF BONDING FILAMENTARY MATERIAL

Robert W. Helda, Scottsdale, Ariz., and William E. La Point, Chelmsford, Mass., assignors to Sylvania Electric Products Inc., a corporation of Delaware Filed Jan. 27, 1966, Ser. No. 523,407
4 Claims. (Cl. 29—471.1)

ABSTRACT OF THE DISCLOSURE

Method of thermal compression "stitch" bonding to connect a length of fine wire between a semiconductor die and a header lead, in which the bonding tool is vibrated while it is moved away from the bond at the header lead thus breaking the wire closely adjacent the bond.

Figure 1:
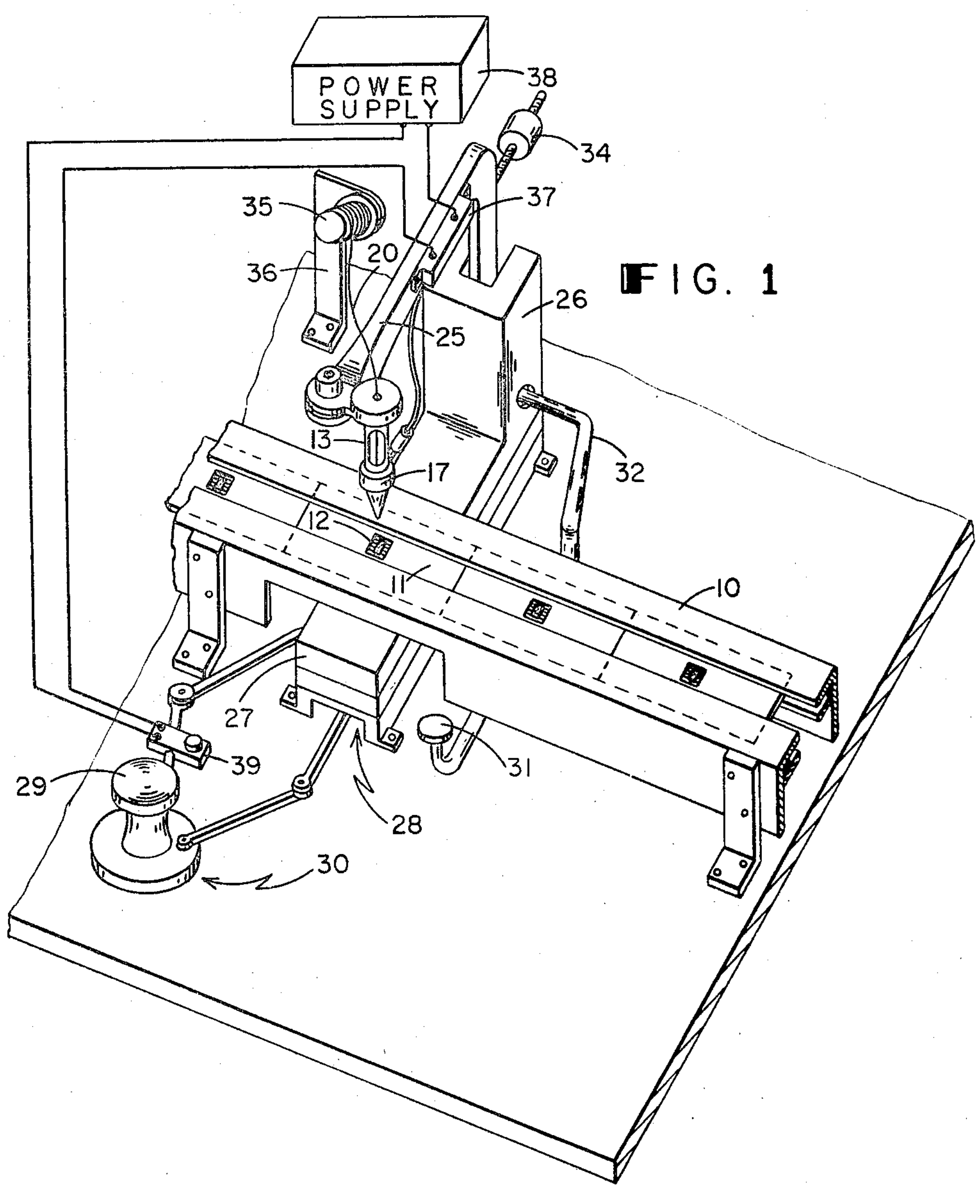

This invention relates to methods of bonding a length of filamentary material to two spaced apart regions of an article. More particularly, it is concerned with methods of bonding a length of connecting wire from a supply of wire to two elements of a semiconductor device to provide an electrical lead therebetween and then severing the bonded lead from the supply.

In the manufacture of semiconductor devices of various types it is commonly the practice to mount a body of semiconductor material containing the electrically active elements of a device on a header or base section of an enclosure. Leads for making electrical contact between various regions of the body of semiconductor material and electrical circuitry external of the device pass through the header and are sealed to it while being electrically insulated from each other. In order to complete the conduction paths to the regions of the body of semiconductor material, electrical connections are made between the regions of the body of semiconductor material and the appropriate leads.

It has become common practice in the semiconductor industry to form electrical connections between the regions of the body of semiconductor material and the appropriate header leads by employing the well-known thermal compression bonding technique. In practicing this technique one end of an extremely fine wire is bonded to a region of the body of semiconductor material by pressing the wire into intimate contact with the region by means of a wedge-shaped bonding tool while heat is applied to the wire and the region. A satisfactory electrical and mechanical bond is thus established between the region of semiconductor material and the wire. The other end of the contact wire is then thermal compression bonded to the appropriate header lead.

In order to maintain continuous control of the wire during the bonding process, thermal compression bonding techniques known generally as "stitch bonding" are commonly employed. These techinques employ a bonding tool which is essentially a hollow needle-like capillary tube. The passage through the tool terminates in an orifice at an end of the tool having an edge suitable for a bonding surface. Wire is fed from a supply of wire on a reel through the passage in the bonding tool until the end portion of the wire protrudes beyond the end of the tool. The protruding end portion is arranged so that it lies across the bonding surface of the tool.

The end portion of the wire is pressed against the region of the body of semiconductor material at which the bond is to be made by means of the bonding tool while heat is applied, thereby producing a thermal compression bond. The tool is then moved relative to the body of semiconductor material and the header to a position adjacent the portion of the header lead where the other end of the connecting lead is to be attached. Wire from the supply passes out through the orifice in the tool during the relative movement of the tool. The tool is then pressed toward the header lead compressing the portion of the contact wire lying between the bonding tool edge and the header lead. Heat is applied and a thermal compression bond is formed. The bonding tool is retracted and the wire is severed at a point intermediate the last bond and the end of the tool leaving a length of wire bonded to the region of the body of semiconductor material and to the header lead. The action of severing the wire is such as to position the new end portion of the wire from the supply across the bonding edge in readiness for the next bonding operation.

In one version of the stitch-bonding technique the protruding end portion of the wire is bent across the bonding edge so that as the bonding tool is moved toward the region of the body of semiconductor material the end portion becomes compressed between the bonding edge and the region. Each new end portion is properly bent across the bonding edge by the action of shears which sever the bonded length of wire from the wire in the supply.

In another version called "nail-head bonding" the protruding end portion of the wire is in the form of a small ball of the material of the wire which is slightly larger than the passage through the tool. The ball is formed when the previous bonded length of wire is severed from the wire in the supply. Severing is accomplished by a jet of flame which, in addition to severing the wire, causes the severed ends to ball up.

Although both of the foregoing stitch-bonding techniques as rescribed produce satisfactory electrical and mechanical bonds, a troublesome tag end of the bonded length of wire results because the wire is severed at some distance from the last bond in order to provide adequate clearance for operation of the severing mechanism. This problem is particularly significant in connecting monolithic integrated circuit networks to header leads because of the presence of many bonded connecting leads within a small space. Since the tag ends are generally longer than the spacing between adjacent header leads, it is necessary to remove the tag ends to prevent almost certain shorting.

The tag ends are commonly removed manually subsequent to the bonding operation as by pulling each tag end with tweezers to break the wire more closely adjacent the final bond. The pull on the final bond occasionally ruptures the bond and frequently weakens the bond. Thus, in addition to the labor expense incurred in the pulling operation and the loss of devices from ruptured bonds there is the possibility that weakened bonds undetected at this point of the manufacturing process might necessitate discard of the device at a later stage after the expenditure of substantial additional manufacturing effort.

It is an object of the present invention, therefore, to provide an improved method of bonding a length of filamentary material to two spaced apart regions of an article.

More specifically, it is an object of the present invention to provide a method of thermal compression bonding a length of wire from a supply of wire to two elements of a semiconductor device to provide an electrical lead therebetween and then severing the bonded lead from the supply without creating a troublesome tag end.

Briefly, in the method of bonding a length of filamentary material to first and second regions of an article according to the invention filamentary material is fed through the passage in a hollow bonding tool until an end portion of the filamentary material protrudes beyond the bonding edge at the end of the tool. The protruding end portion of the filamentary material is oriented between the bonding edge at the end of the tool and a first region of the article. The protruding end portion is pressed against the first region of the article by means of the bonding edge and is bonded to the first region. Then, the position of the bonding tool with respect to the article is changed, positioning the bonding tool adjacent the second region of the article. The portion of the filamentary material lying interposed between the bonding edge of the bonding tool and the second region is pressed against the second region by means of the bonding edge of the bonding tool, and that portion of the filamentary material is bonded to the second region. The bonding tool is removed from pressing relationship against the bonded portion of the filamentary material. Then, the bonding tool is vibrated to sever the filamentary material. The filamentary material fractures closely adjacent the final bond thereby leaving eessentially no tag end.

Figure 2:
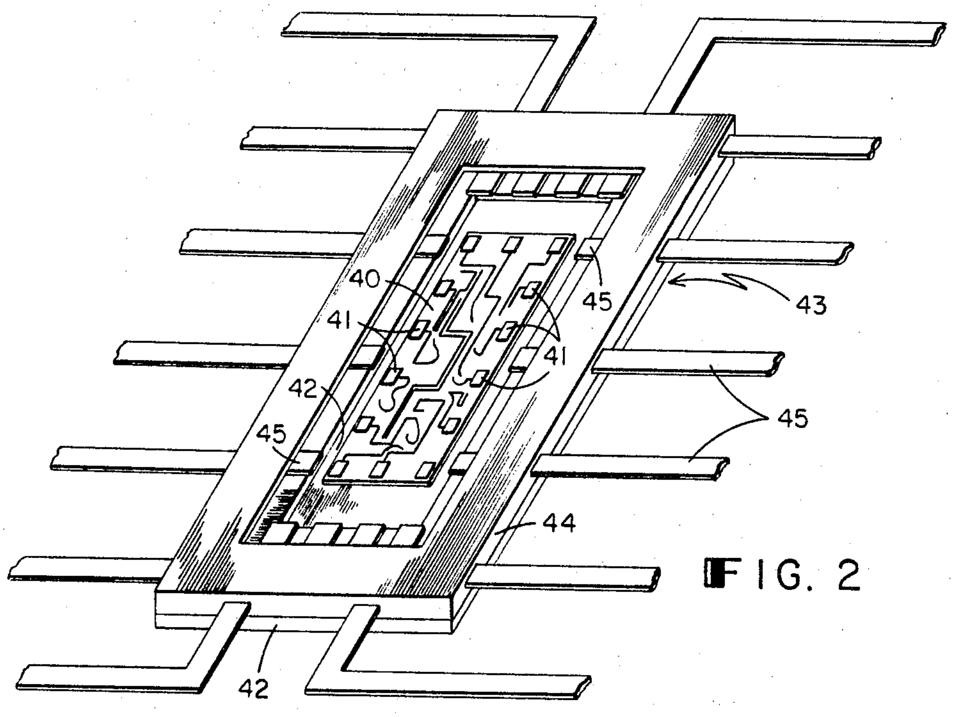

Additional objects, features, and advantages of the method of the invention will be apparent from the following detailed discussion and the accompanying drawings wherein:

FIG. 1 is a perspective view of one type of apparatus which may be employed in bonding lengths of wire to semiconductor devices in accordance with the method of the invention;

FIG. 2 is a perspective view of a body of semiconductor material, which contains an integrated circuit network, mounted on the header of an enclosure prior to the bonding of connecting leads from the body of semiconductor material to the header leads; and FIGS. 3 through 9 are cross-sectional views of portions of the apparatus of FIG. 1 and semiconductor device of FIG. 2 illustrating various stages in the process of bonding connecting leads from the body of semiconductor material to the header leads in accordance with the method of the invention.

Because of the extremely small actual size of various elements of the semiconductor devices and apparatus illustrated in the drawings, in some of the figures certain portions of the devices and the apparatus are shown disproportionate in size to other portions. It is believed that greater clarity of presentation is thereby obtained despite consequent distortion of elements in relation to their actual physical appearance.

The apparatus illustrated in FIG. 1 is similar to widely used types of thermal compression bonding apparatus employed in bonding lead wires to semiconductor devices by the stitch-bonding outlined above. The apparatus includes a track 10 for supporting holders 11 on which semiconductor devices 12 are mounted. The holders are moved along the track to position a semiconductor device at the bonding location generally beneath a bonding tool 13. A heating arrangement (not shown) is located beneath the track at the bonding location in order to raise the temperature of the semiconductor device to a suitable level for thermal compression bonding.

The bonding tool 13 is a hollow tube-like member which tapers to a bonding edge 14 of very small circumference at its lower end as best seen in FIGS. 3 through 9. The passage 15 through the tool tapers to a very small orifice 16 at the bonding edge. The orifice is only slightly larger than the wire 20 which passes through it. The bonding tool includes a heater element 17 for heating the tip of the tool.

The bonding tool 13 is fixed to one end of a supporting arm 25. The other end of the arm 25 is pivotally mounted within a housing 26. The housing is supported on a movable plate 27. An arrangement of low friction sliding blocks 28 permits complete freedom of movement of the movable plate 27 within a horizontal plane. Movement is imparted to the plate 27 manually by movement of the knob 29 of a micromanipulator linkage 30. The micromanipulator linkage 30 is arranged so that relatively large movement of the knob 29 in any direction in a horizontal plane produces relatively small proportional movement of the plate 27 and consequently of the bonding tool 13 in the same direction.

The bonding tool 13 is raised and lowered manually by the proportional movement of the height control knob 31. The knob 31 is mounted on a control arm 32 which is appropriately linked to the bonding tool support arm 25 within the housing 26. The action of the linkage is such that when the bonding tool is lowered into contact with an article, further downward movement of the control knob 31 disengages the control arm 32 from the support arm 25. Thus, the force exerted by the bonding tool 13 on the article is determined only by the distribution of weight carried by the supporting arm 25 and its associated weight control balance 34.

By horizontal movement of the micromanipulator knob 29 and vertical movement of the height control knob 31 an operator can precisely manipulate the bonding tool 13 with respect to the semiconductor device 12 in the bonding location on the supporting track 10. The semiconductor device 12 at the bonding location and the tip of the bonding tool 13 are observed by the operator through a suitable binocular microscope (not shown).

A supply of fine contact wire 20 on a reel 35 is mounted on a support 36. The wire is fed through the passage 15 in the bonding tool 13 and protrudes beyond the bonding edge 14 at the lower end of the bonding tool.

The apparatus of FIG. 1 differs from that heretofore commonly employed for thermal compression bonding in that a vibrator 37 is mounted on the bonding tool support arm 25. The vibrator may be a simple electromechanical buzzer, and is connected to a suitable power supply 38 through a switch 39 as shown schematically in FIG. 1. The switch 39 may be mounted on an arm of the micromanipulator linkage 30 adjacent the knob 29 so that the operator can readily actuate the switch with her left hand without releasing the knob.

By way of example, one type of semiconductor device to which contact wires may be bonded by the apparatus of FIG. 1 and in accordance with the method of the invention as illustrated in FIG. 2. The device 12 includes a body 40 of semiconductor material into which conductivity type imparting materials are selectively diffused to produce an integrated circuit network. A pattern of circuit intraconnections are formed on the surface of the body of semiconductor material by appropriate metal deposition techniques. The intraconnections include several relatively large metal areas 41 designated bonding pads to which lead wires are to be bonded for providing electrical connections to the circuit.

The body of semiconductor material 40 is mounted on the metal base plate 42 of the header portion 43 of an enclosure. A ring-like member 44 of ceramic is sealed to the metal plate 42. Header leads 45 pass through the ceramic ring 44. The end portions of the leads within the enclosure lie adjacent to body of semiconductor material 40.

Figure 3:
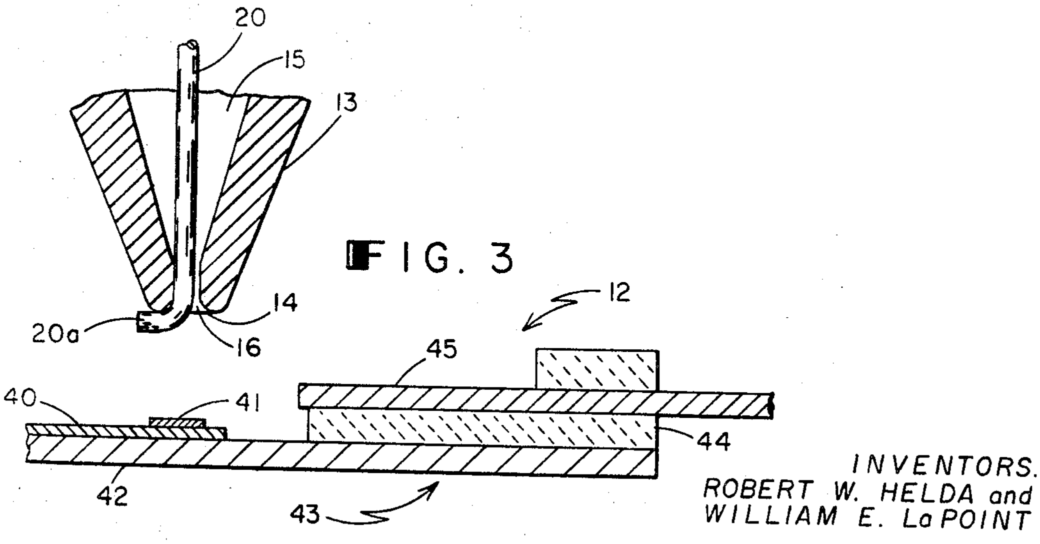

The apparatus of FIG. 1 is employed to bond a length of contact wire from each of the bonding pads 41 on the body of semiconductor material to the appropriate header leads 45 in accordance with the method of the invention. The apparatus is readied for use by feeding wire 20 from the supply on the reel 35 through the passage in the tool until the end of the wire protrudes beyond the tip of the tool. The protruding end portion 20_a_ of the wire is oriented to lie across the bonding edge 14 of the bonding tool generally transverse to the passage 15 through the tool as shown in FIG. 3. Initial loading and positioning of the wire is done by hand, but as will be apparent from the following discussion subsequent proper orientation of the protruding end portion 20_a_ of the wire for any one bonding operation is accomplished automatically during the final steps in the bonding operation preceding the one bonding operation.

Figure 4:
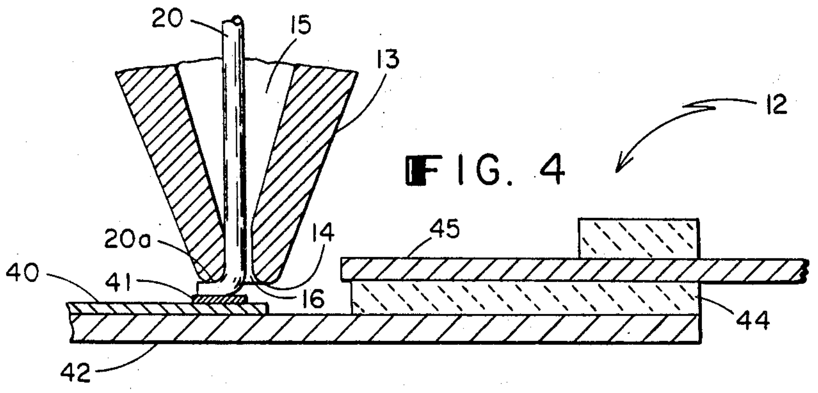

The bonding tool 13 is maneuvered into position above a bonding pad 41 of the semiconductor device 12 at the bonding location of the apparatus as shown in FIG. 3 by manipulation of the knobs 29 and 31. Then, the bonding tool is lowered and the protruding end portion 20*a* of the wire is pressed against the bonding pad 41 by the bonding edge 14 of the tool as illustrated in FIG. 4. Under proper conditions of pressure and heat the end portion 20*a* of the wire is thermal compression bonded to the bonding pad.

Figure 5:
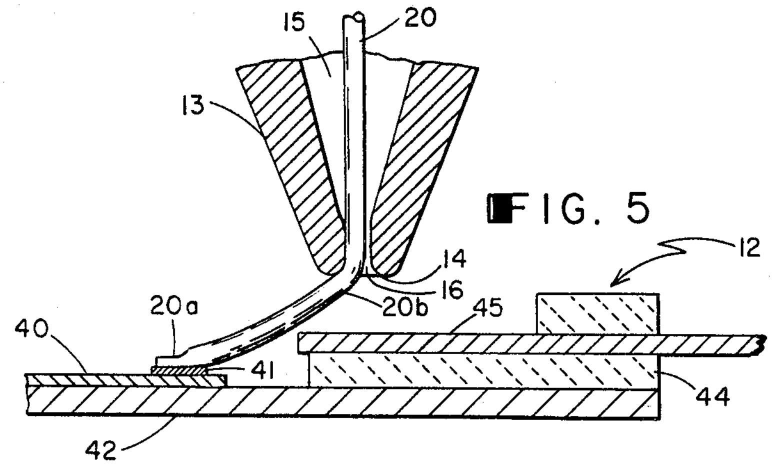

Next, the bonding tool is raised slightly and moved into position above the appropriate header lead 45 as illustrated in FIG. 5. As the tool 13 is moved with respect to the semiconductor device 12 and the bonded end portion 20*a* of the wire, wire from the supply passes through the passage 15 in the tool placing another portion 20*b* of the wire adjacent the bonding edge 14. The operator maintains a slack section in the wire between the reel 35 and the bonding tool 13 to insure that no unnecessary strain is placed on the bonded portion of the wire.

Figure 6:
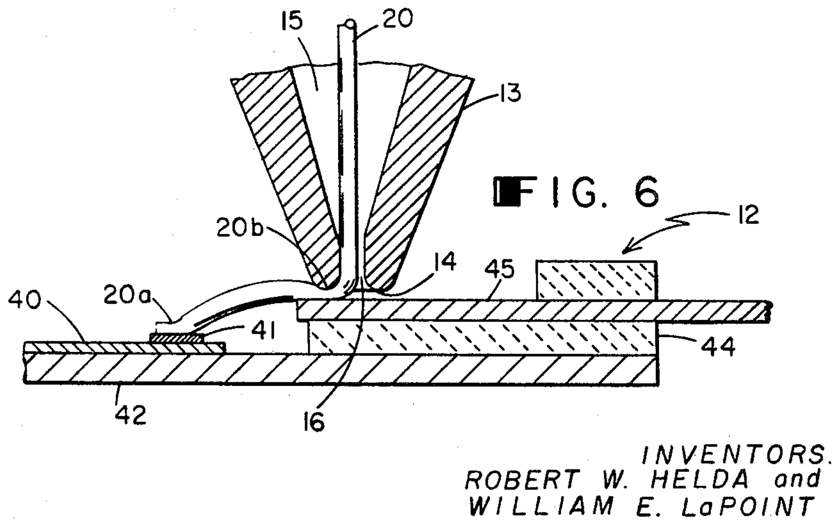

The bonding tool 13 is lowered pressing the portion 20*b* of the wire interposed between the bonding edge 14 and the header lead 45 against the surface of the header lead as illustrated in FIG. 6. Under proper conditions of pressure and heat the wire is thermal compression bonded to the lead.

Figure 7:
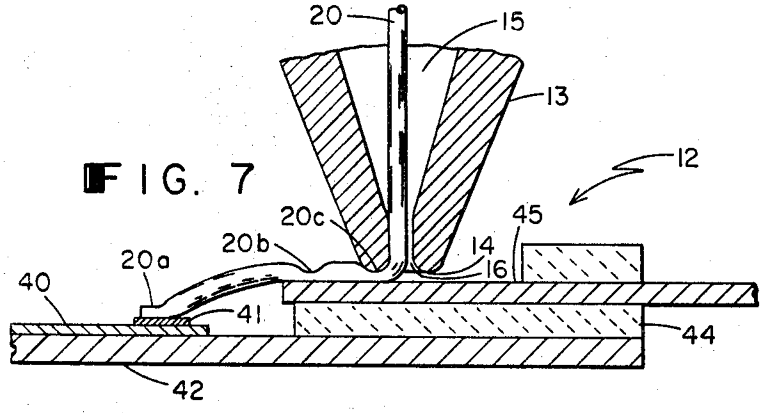

Then, the bonding tool is raised slightly, shifted a short distance, and lowered again as shown in FIG. 7. Thus, a second portion 20*c* of the wire is bonded to the header lead 45. Through this stage the procedure is essentially the same as that commonly followed in practicing the known stitch-bonding technique of thermal compression bonding.

Figure 8:
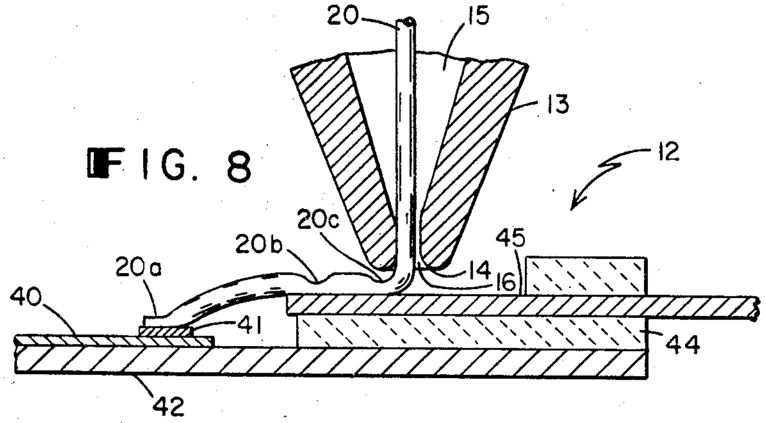
Figure 9:
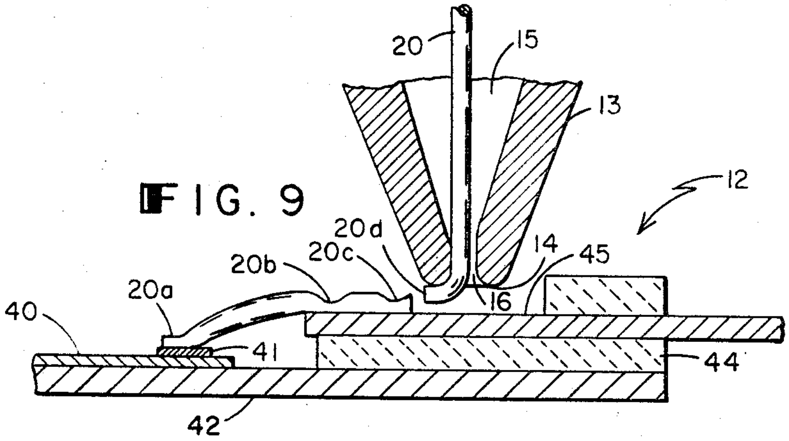

After the second bond is made to the header lead, the bonding tool is raised a short distance from the bonded portion 20*c* of the wire as shown in FIG. 8 so as to remove the tool from pressing relationship against the bonded portion of the wire and the header lead. Then, the vibrator 37 is actuated by closing the switch 39. The action of the vibrator causes the bonding tool 13 to vibrate or oscillate primarily generally transverse to the passage 15 through the tool. The vibration fatigues the wire causing the wire to break adjacent the bonded portion 20*c*. While the bonding tool is being vibrated, it is moved horizontally away from the bond. The portion of the wire adjacent the bonded portion is thus drawn against the bonding edge 14 of the bonding tool 13 exerting some tension on the wire and the wire is more readily severed. As illustrated in FIG. 9 the wire breaks at a predictable point closely adjacent the last bond, and a new end portion 20*d* of the wire from the supply of predetermined length protrudes beyond the end of the tool. The new end portion 20*d* is of appropriate length so that it extends across the bonding edge 14 in proper position to be bonded during the subsequent bonding operation without producing a loose end which might short to conductive paths on the body of semiconductor material.

The method of the invention has been employed in bonding lengths of gold wire .001 inch in diameter from aluminum bonding pads 41 on a silicon semiconductor body 40 to the gold-plated Kovar leads 45 of a header 43. The passage 15 through the bonding tool was about .0015 inch in diameter at the lower orifice 16. The bonding edge 14 exerted a pressure of about 8,000 to 10,000 pounds per square inch on the wire. The tip of the bonding tool was heated to a temperature of about 210° C. and the surface of the silicon body was heated to approximately 300° C.

After completion of the second bond to the header lead, the tool was raised a distance of the order of a mil prior to actuating the vibrator and moving the tool laterally. The vibrator caused the tip of the bonding tool to oscillate at a rate of 60 vibrations per second over a total horizontal excursion of from about ½ mil to 1 mil. The new end portion 20*d* of the wire protruding beyond the orifice of the passage was uniformly about 1½ to 2 mils.

Contact wires attached in the foregoing manner do not have a tag end which must be removed in order to eliminate the possibility of shorting. Each length of wire is severed from the supply closely adjacent the last bond as illustrated in FIG. 9. Thus, the last bond to the header lead is not weakened by a strong pulling, peeling, or lifting action to which it was subjected in prior art methods during the steps of removing the tag end. The first bond to the header lead is completely isolated from the effects of the severing action. In addition to providing superior bonds of uniform quality, the foregoing method significantly reduces the time and labor required for bonding lengths of contact wire to a body of semiconductor material and its header leads by eliminating the steps of removing the tag ends.

In severing the bonded length of wire from the supply in the foregoing manner the newly formed end portion of the wire of the supply is oriented in position for the next bond. Movement of the vibrating bonding tool away from the bonded portion of the wire causes the section of the wire adjacent the aperture in the bonding tool to bear against the bonding tool. The degree of friction between the wire and the bonding tool is sufficient to exceed the forces exerted by any set in the wire so that after the bonded length of wire is severed from the supply, the new protruding end portion does not twist or otherwise shift position.

These advantages make it possible to enhance further the quality of the connections between the bonding pads and the header leads. It is considered desirable for each bonded length of wire to extend along a straight line as viewed from above. Not only should the movement of the bonding tool be along a straight line so as to place all three bonds in line, but the first end portion bonded to the bonding pad should lie in the same line so that there will be no bends along the length of the wire. That is, the protruding end portion of the wire adjacent the bonding edge of the bonding tool should extend in the direction opposite to that in which the bonding tool will be moved in attaching the next length of contact wire in order to avoid any bend at the next bond.

In practicing the method as described above, the operator can move the vibrating bonding tool away from the last bond in a horizontal direction such that when the wire is severed the newly formed end portion extends in a preferred direction. It may not always be possible to move the bonding tool in the direction which produces the optimum position of the newly formed end portion. However, in the process of attaching contact wires to an integrated circuit device of the type illustrated in FIG. 2, it is possible to control the orientation of the new end portions of the wire sufficiently so that high quality relatively strain free bonds are obtained.

While there has been shown and described what is considered a preferred embodiment of the present invention, it will be obvious to those skilled in the art that various changes and modifications may be made therein without departing from the invention as defined in the appended claims.

We claim:

1. The method of bonding a length of filamentary material to first and second regions of an article including the steps of:

feeding filamentary material through the passage in a hollow bonding tool until an end portion of the filamentary material protrudes beyond the bonding edge at the end of the tool, orienting the protruding end portion of the filamentary material between the bonding edge at the end of the tool and the first region of the article, pressing the protruding end portion of the filamentary material against the first region of the article by means of said bonding edge and bonding the end portion of the filamentary material to the first region, changing the position of the bonding tool with respect to the article to position the bonding tool adjacent the second region of the article, pressing the portion of the filamentary material lying interposed between the bonding edge of the bonding tool and the second region against the second region by means of said bonding edge and bonding said portion of the filamentary material to the second region, removing the bonding tool from pressing relationship against the last-bonded portion of the filamentary material and the second region of the article, changing the position of the bonding tool with respect to the last-bonded portion of the filamentary material in a particular direction transverse to the passage through the bonding tool, and vibrating the bonding tool while changing the position of the bonding tool whereby the filamentary material severs adjacent the last-bonded portion of the filamentary material and the new end portion of the filamentary material protrudes beyond the bonding edge and extends in a predetermined direction.

2. The method of bonding a length of filamentary material to first and second regions of an article according to claim 1 in which:

said bonding tool is vibrated transverse to the passage in the bonding tool.

3. The method of thermal compression bonding a length of wire from a metal surface on a body of semiconductor material to the lead of a header on which said body is mounted including the steps of:

providing a bonding tool having a passage extending therethrough and terminating at a bonding surface at the end of the tool, feeding wire from a supply through the passage until the end portion of the wire protrudes beyond the bonding surface, orienting the protruding end portion of the wire adjacent the bonding surface with the end portion lying generally transverse to the passage through the tool, pressing the protruding end portion of the wire against the metal surface on the body of semiconductor material by means of the bonding surface while heating the metal surface and the end portion of the wire to form a thermal compression bond between the end portion of the wire and the metal surface, changing the position of the bonding tool with respect to the body of semiconductor material and header to position the bonding tool adjacent the header lead whereby wire from the supply passes through the passage in the bonding tool placing another portion of the wire adjacent the bonding surface with the portion lying generally transverse to the passage through the tool, pressing the other portion of the wire against a portion of the header lead by means of the bonding surface while heating the portion of the header lead and the other portion of the wire to form a thermal compression bond between the other portion of the wire and the header lead, removing the bonding tool from pressing relationship against the last-bonded portion of the wire, changing the position of the bonding tool with respect to the last-bonded portion of the wire in a particular direction transverse to the passage through the bonding tool, and vibrating the bonding tool transverse to the passage through the bonding tool while changing the position of the bonding tool with respect to the last-bonded portion of the wire in a particular direction whereby the wire severs adjacent the last-bonded portion of the wire and the new end portion of the wire from the supply protrudes beyond the bonding surface and extends generally transverse to the passage through the tool in a direction opposite said particular direction.

4. The method of thermal compression bonding a length of wire from a metal surface on a body of semiconductor material to the lead of a header on which said body is mounted according to claim 3 wherein subsequent to the step of pressing the other portion of the wire against a portion of the header lead by means of the bonding surface while heating the portion of the header lead and the other portion of the wire and prior to the step of removing the bonding tool from pressing relationship against the last-bonded portion of the wire the following steps are included:

changing the position of the bonding tool with respect to the body of semiconductor material and header to position the bonding tool adjacent the header lead whereby wire from the supply passes through the passage in the bonding tool placing a third portion of the wire adjacent the bonding surface with the third portion lying generally transverse to the passage through the tool, and pressing the third portion of the wire against a second portion of the header lead by means of the bonding surface while heating the second portion of the header lead and the third portion of the wire to form a thermal compression bond between the third portion of the wire and the header lead.

References Cited

UNITED STATES PATENTS

| | | | |
|---|---|---|---|
| 3,056,320 | 10/1962 | Findley. | |
| 3,083,595 | 4/1963 | Frank et al. | |
| 3,128,649 | 4/1964 | Avila et al. | 29—497.5 X |
| 3,149,510 | 9/1964 | Kolicke. | |
| 3,216,640 | 11/1965 | Szasz. | |

JOHN F. CAMPBELL, *Primary Examiner.*

J. L. CLINE, *Assistant Examiner.*